United States Patent
Yang

(10) Patent No.: US 12,307,088 B2
(45) Date of Patent: May 20, 2025

(54) METHOD AND APPARATUS FOR PERFORMING DATA RETENTION MANAGEMENT OF MEMORY DEVICE WITH AID OF PRE-SHUTDOWN CONTROL

(71) Applicant: Silicon Motion, Inc., Hsinchu County (TW)

(72) Inventor: Tsung-Chieh Yang, Hsinchu (TW)

(73) Assignee: Silicon Motion, Inc., Hsinchu County (TW)

( * ) Notice: Subject to any disclaimer, the term of this patent is extended or adjusted under 35 U.S.C. 154(b) by 69 days.

(21) Appl. No.: 17/870,861

(22) Filed: Jul. 22, 2022

(65) Prior Publication Data

US 2024/0028198 A1     Jan. 25, 2024

(51) Int. Cl.
*G06F 3/06* (2006.01)

(52) U.S. Cl.
CPC .......... *G06F 3/0607* (2013.01); *G06F 3/0656* (2013.01); *G06F 3/0679* (2013.01)

(58) Field of Classification Search
CPC .... G06F 3/0607; G06F 3/0656; G06F 3/0679; G06F 3/0604; G06F 3/0614; G06F 3/0616; G06F 3/0617; G06F 3/0619; G06F 3/0658
See application file for complete search history.

(56) References Cited

U.S. PATENT DOCUMENTS

| | | |
|---|---|---|
| 2012/0239976 A1 | 9/2012 | Cometti |
| 2013/0103887 A1 | 4/2013 | Frey |
| 2014/0310534 A1* | 10/2014 | Gurgi .................. G06F 12/0246 713/193 |
| 2017/0177235 A1* | 6/2017 | Nishikubo .......... G11C 11/5628 |
| 2017/0277588 A1* | 9/2017 | Kim ..................... G11C 16/105 |
| 2018/0052767 A1 | 2/2018 | Berke |

(Continued)

FOREIGN PATENT DOCUMENTS

| | | |
|---|---|---|
| CN | 108984336 A | 12/2018 |
| TW | I475484 | 3/2015 |

OTHER PUBLICATIONS

Geeks for Geeks, "Representing Instructions in Computer," Mar. 14, 2022, https://www.geeksforgeeks.org/representing-instructions-in-computer/.*

*Primary Examiner* — Tracy A Warren
(74) *Attorney, Agent, or Firm* — Winston Hsu

(57) ABSTRACT

A method for performing data retention management of a memory device with aid of pre-shutdown control and associated apparatus are provided. The method may include: receiving a predetermined host command from a host device; in response to the predetermined host command, performing a re-programming procedure on the NV memory, for enhancing data storage reliability of the memory device, for example, reading stored data from at least one source location within the at least one NV memory element to prepare re-programming data according to the stored data, and programming the re-programming data into at least one destination location within the at least one NV memory element to be replacement of the stored data; and in response to the re-programming procedure being completed, sending completion information of the predetermined host command to the host device, to allow the host device to trigger the shutdown of the memory device.

12 Claims, 7 Drawing Sheets

(56) References Cited

U.S. PATENT DOCUMENTS

| | | | |
|---|---|---|---|
| 2020/0310959 A1* | 10/2020 | Byun | G06F 3/0608 |
| 2020/0379898 A1* | 12/2020 | Yang | G06F 3/0688 |
| 2021/0136366 A1* | 5/2021 | Muthiah | H04N 19/12 |
| 2023/0048514 A1* | 2/2023 | Wu | G06F 3/0625 |
| 2023/0384972 A1* | 11/2023 | Izzi | G06F 3/0659 |

* cited by examiner

METHOD AND APPARATUS FOR PERFORMING DATA RETENTION MANAGEMENT OF MEMORY DEVICE WITH AID OF PRE-SHUTDOWN CONTROL

BACKGROUND OF THE INVENTION

1. Field of the Invention

The present invention is related to memory control, and more particularly, to a method and apparatus for performing data retention management of a memory device with aid of pre-shutdown control.

2. Description of the Prior Art

A memory device may comprise a Flash memory for storing data, and the management of accessing the Flash memory is complicated. For example, the memory device may be a memory card, a solid state drive (SSD), or an embedded storage device such as that conforming to Universal Flash Storage (UFS) specification. When it is needed to perform disk roaming on the memory device such as the SSD, some problems may occur. More particularly, a server manager may prepare predetermined data such as catalog data, etc. in some SSDs for a possible need in the future, and put these SSDs in a place where there is no air conditioner. At the time when the server manager tries to install the SSDs with the predetermined data such as catalog data, etc. at a latest purchased back-end server, various types of error handling mechanisms of these SSDs may be triggered by data errors. As a result, the SSDs may spend too much time on performing some internal operations regarding the various types of error handling mechanisms, and therefore cannot immediately operate in response to host-side requests, causing the overall performance to be reduced. Thus, a novel method and associated architecture are needed for solving the problems without introducing any side effect or in a way that is less likely to introduce a side effect.

SUMMARY OF THE INVENTION

It is therefore an objective of the present invention to provide a method and apparatus for performing data retention management of a memory device with aid of pre-shutdown control, in order to solve the above-mentioned problems.

At least one embodiment of the present invention provides a method for performing data retention management of a memory device with aid of pre-shutdown control, where the method can be applied to a memory controller of the memory device. The memory device may comprise the memory controller and a non-volatile (NV) memory, and the NV memory may comprise at least one NV memory element (e.g., one or more NV memory elements). The method may comprise: receiving a predetermined host command from a host device, wherein the predetermined host command indicates that shutdown of the memory device is requested; and in response to the predetermined host command, performing a re-programming procedure on the NV memory, for enhancing data storage reliability of the memory device, wherein the re-programming procedure comprises: reading at least one set of stored data from at least one source location within the at least one NV memory element to prepare at least one set of re-programming data according to the at least one set of stored data, wherein the at least one set of stored data is stored at the at least one source location before the re-programming procedure is performed; and programming the at least one set of re-programming data into at least one destination location within the at least one NV memory element to be replacement of the at least one set of stored data. The method may further comprise: in response to the re-programming procedure being completed, sending completion information of the predetermined host command to the host device, to allow the host device to trigger the shutdown of the memory device.

In addition to the above method, the present invention also provides a memory device, and the memory device comprises a NV memory and a memory controller. The NV memory is arranged to store information, wherein the NV memory may comprise at least one NV memory element (e.g. one or more NV memory elements). The memory controller is coupled to the NV memory, and the memory controller is arranged to control operations of the memory device. In addition, the memory controller comprises a processing circuit that is arranged to control the memory controller according to a plurality of host commands from a host device, to allow the host device to access the NV memory through the memory controller. For example, the memory controller receives a predetermined host command from the host device, wherein the predetermined host command indicates that shutdown of the memory device is requested; and in response to the predetermined host command, the memory controller performs a re-programming procedure on the NV memory, for enhancing data storage reliability of the memory device, wherein the re-programming procedure comprises: reading at least one set of stored data from at least one source location within the at least one NV memory element to prepare at least one set of re-programming data according to the at least one set of stored data, wherein the at least one set of stored data is stored at the at least one source location before the re-programming procedure is performed; and programming the at least one set of re-programming data into at least one destination location within the at least one NV memory element to be replacement of the at least one set of stored data. Additionally, in response to the re-programming procedure being completed, the memory controller sends completion information of the predetermined host command to the host device, to allow the host device to trigger the shutdown of the memory device.

According to some embodiments, an associated electronic device is also provided. The electronic device may comprise the above memory device, and may further comprise: the host device, coupled to the memory device. The host device may comprise: at least one processor, arranged for controlling operations of the host device; and a power supply circuit, coupled to the at least one processor, arranged for providing power to the at least one processor and the memory device. In addition, the memory device may provide the host device with storage space.

In addition to the above method, the present invention also provides a memory controller of a memory device, where the memory device comprises the memory controller and a NV memory. The NV memory may comprise at least one NV memory element (e.g. one or more NV memory elements). In addition, the memory controller comprises a processing circuit that is arranged to control the memory controller according to a plurality of host commands from a host device, to allow the host device to access the NV memory through the memory controller. For example, the memory controller receives a predetermined host command from the host device, wherein the predetermined host command indicates that shutdown of the memory device is requested; and in response to the predetermined host command, the memory controller performs a re-programming procedure on the NV memory, for enhancing data storage reliability of the memory device, wherein the re-programming procedure comprises: reading at least one set of stored data from at least one source location within the at least one NV memory element to prepare at least one set of re-programming data according to the at least one set of stored data, wherein the at least one set of stored data is stored at the at least one source location before the re-programming procedure is performed; and programming the at least one set of re-programming data into at least one destination location within the at least one NV memory element to be replacement of the at least one set of stored data. Additionally, in response to the re-programming procedure being completed, the memory controller sends completion information of the predetermined host command to the host device, to allow the host device to trigger the shutdown of the memory device.

The present invention method and apparatus can guarantee that the memory device can operate properly in various situations, and more particularly, prevent spending too much time on performing some internal operations of the memory device in response to host-side write requests. For example, in a situation where it is needed to perform disk roaming on the memory device such as a solid state drive (SSD), the memory device (e.g., the memory controller therein) can perform data retention management with aid of pre-shutdown control, to enhance the programming states in the NV memory, and therefore guarantee data storage reliability of the memory device with respect to time. As a result, at the time when the memory device with predetermined data is installed at a new host device, the memory device (e.g., the memory controller therein) can guarantee correctness of the predetermined data stored in the NV memory, and can operate properly without being hindered by some internal operations of the memory device (e.g., the internal operations regarding various types of error handling mechanisms of the memory device). In addition, the present invention method and apparatus can solve the related art problems without introducing any side effect or in a way that is less likely to introduce a side effect.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
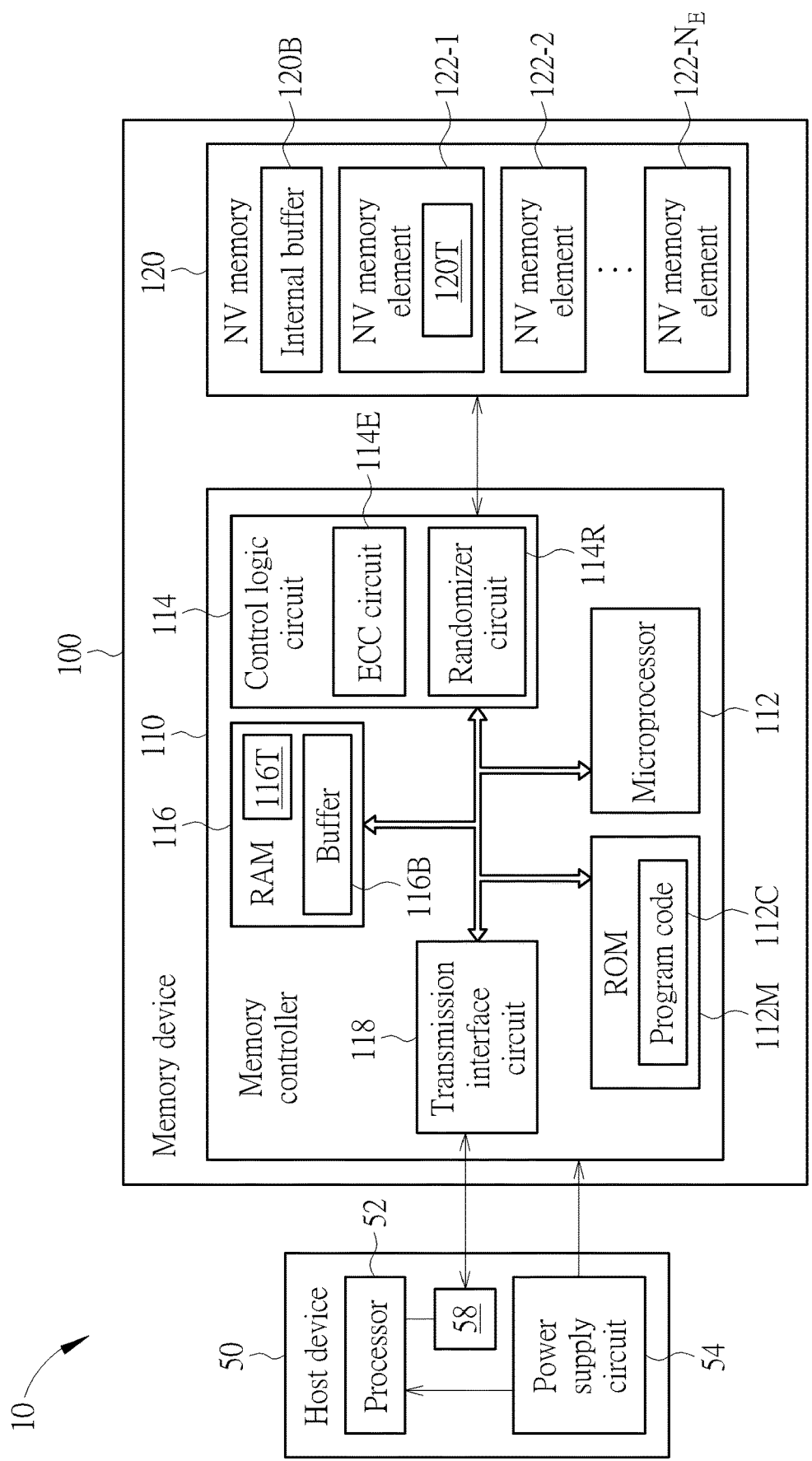
FIG. 1 is a diagram of an electronic device according to an embodiment of the present invention.

FIG. 1 is a diagram of an electronic device 10 according to an embodiment of the present invention, where the electronic device 10 may comprise a host device 50 and a memory device 100. The host device 50 may comprise at least one processor (e.g., one or more processors) which may be collectively referred to as the processor 52, a power supply circuit 54, and a transmission interface circuit 58, where the processor 52 and the transmission interface circuit 58 may be coupled to each other through a bus, and may be coupled to the power supply circuit 54 to obtain power. The processor 52 may be arranged to control operations of the host device 50, and the power supply circuit 54 may be arranged to provide the processor 52, the transmission interface circuit 58, and the memory device 100 with power, and output one or more driving voltages to the memory device 100, where the memory device 100 may provide the host device 50 with storage space, and may obtain the one or more driving voltages from the host device 50, to be the power of the memory device 100. Examples of the host device 50 may include, but are not limited to: a multifunctional mobile phone, a tablet computer, a wearable device, and a personal computer such as a desktop computer and a laptop computer. Examples of the memory device 100 may include, but are not limited to: a portable memory device (e.g., a memory card conforming to the SD/MMC, CF, MS or XD specification), a solid state drive (SSD), and various types of embedded memory devices (e.g., an embedded memory device conforming to the UFS or eMMC specification). According to this embodiment, the memory device 100 may comprise a controller such as a memory controller 110, and may further comprise a non-volatile (NV) memory 120, where the memory controller 110 is arranged to access the NV memory 120, and the NV memory 120 is arranged to store information. The NV memory 120 may comprise an internal buffer 120B, and may further comprise at least one NV memory element (e.g., one or more NV memory elements), such as a plurality of NV memory elements 122-1, 122-2, ..., and 122-$N_E$, where "$N_E$" may represent a positive integer that is greater than one. For example, the NV memory 120 may be a flash memory, and the plurality of NV memory elements 122-1, 122-2, ..., and 122-$N_E$ may be a plurality of flash memory chips or a plurality of flash memory dies, respectively, but the present invention is not limited thereto.

As shown in FIG. 1, the memory controller 110 may comprise a processing circuit such as a microprocessor 112, a storage unit such as a read only memory (ROM) 112M, a control logic circuit 114, a random access memory (RAM) 116 (which may be implemented by way of static random access memory (SRAM), for example), and a transmission interface circuit 118, where at least one portion (e.g., a portion or all) of the above components may be coupled to one another via a bus. The RAM 116 may comprise one or more storage regions, and may be arranged to provide the memory controller 110 with internal storage space (for example, may temporarily store information), and more particularly, may comprise a buffer 116B that is implemented with a certain storage region among the one or more storage regions, for buffering data such as write data (e.g., data to be written) from the host device 50, read data (e.g., data to be read) from the NV memory 120, etc., but the present invention is not limited thereto. In addition, the ROM 112M of this embodiment is arranged to store a program code 112C, and the microprocessor 112 is arranged to execute the program code 112C to control the access of the NV memory 120. Please note that, the program code 112C may also be stored in the RAM 116 or any type of memory. Additionally, the control logic circuit 114 may be arranged to control the NV memory 120. The control logic circuit 114 may comprise an error correction code (ECC) circuit 114E for performing ECC encoding and ECC decoding operations in order to protect data and/or perform error correction, and may further comprise a randomizer circuit 114R for performing randomizing and de-randomizing operations.

For example, during a write procedure, the memory controller 110 (e.g., the microprocessor 112) can utilize the ECC circuit 114E (e.g., an ECC encoder therein) to perform ECC encoding operations on the write data (e.g., the aforementioned data to be written) from the host device 50, in order to generate encoded data of the write data, and can utilize the randomizer circuit 114R (e.g., a randomizer therein) to perform randomizing operations on the encoded data to generate randomized data and store the randomized data into the NV memory 120. In addition, during a read procedure, the memory controller 110 (e.g., the microprocessor 112) can utilize the randomizer circuit 114R (e.g., a de-randomizer therein) to perform de-randomizing operations on previously stored data such as the randomized data, in order to generate de-randomized data such as a recovered version of the encoded data, and can utilize the ECC circuit 114E (e.g., an ECC decoder therein) to perform ECC decoding operations on the de-randomized data such as the recovered version of the encoded data, in order to generate decoded data such as a recovered version of the write data (e.g., the aforementioned data to be written) to be the read data (e.g., the aforementioned data to be read), for being returned to the host device 50. This is for illustrative purpose only, and is not meant to be a limitation of the present invention. According to some embodiments, the order of performing the ECC encoding operations and the randomizing operations and the order of performing the ECC decoding operations and the de-randomizing operations can be changed. For example, during another write procedure, the memory controller 110 (e.g., the microprocessor 112) can utilize the randomizer circuit 114R (e.g., the randomizer therein) to perform randomizing operations on the write data (e.g., the aforementioned data to be written) from the host device 50, in order to generate the corresponding randomized data of the write data, and can utilize the ECC circuit 114E (e.g., the ECC encoder therein) to perform ECC encoding operations on the corresponding randomized data of the write data, in order to generate encoded data of the corresponding randomized data and store the encoded data into the NV memory 120. In addition, during a read procedure, the memory controller 110 (e.g., the microprocessor 112) can utilize the ECC circuit 114E (e.g., an ECC decoder therein) to perform ECC decoding on previously stored data such as the encoded data, in order to generate decoded data such as a recovered version of the corresponding randomized data, and can utilize the randomizer circuit 114R (e.g., a de-randomizer therein) to perform de-randomizing operations on the decoded data, in order to generate de-randomized data such as a recovered version of the write data (e.g., the aforementioned data to be written) to be the read data (e.g., the aforementioned data to be read), for being returned to the host device 50.

Regarding the communications between the memory device 100 (e.g., the memory controller 110) and the host device 50, the transmission interface circuit 118 may conform to one or more communications specifications among various communications specifications (e.g., the Serial Advanced Technology Attachment (SATA) specification, Universal Serial Bus (USB) specification, Peripheral Component Interconnect Express (PCIe) specification, Non-Volatile Memory Express (NVMe) specification, embedded Multi Media Card (eMMC) specification, and Universal Flash Storage (UFS) specification), and may perform communications with the host device 50 (e.g., the transmission interface circuit 58) according to the one or more communications specifications for the memory device 100. Similarly, the transmission interface circuit 58 may conform to the one or more communications specifications, and may perform communications with the memory device 100 (e.g., the transmission interface circuit 118) according to the one or more communications specifications for the host device 50.

In this embodiment, the host device 50 may transmit a plurality of host commands and corresponding logical addresses to the memory controller 110, to access the NV memory 120 within the memory device 100, indirectly. The memory controller 110 receives the plurality of host commands and the logical addresses, and translates the plurality of host commands into memory operating commands (which may be referred to as operating commands, for brevity), respectively, and further controls the NV memory 120 with the operating commands to perform reading or writing/programming upon the memory units or data pages of corresponding physical addresses within the NV memory 120, where the physical addresses can be associated with the logical addresses. For example, the memory controller 110 may generate or update at least one logical-to-physical (L2P) address mapping table to manage the relationship between the physical addresses and the logical addresses, where the NV memory 120 may store a global L2P address mapping table 120T, for the memory controller 110 to control the memory device 100 to access data in the NV memory 120, but the present invention is not limited thereto.

For better comprehension, the global L2P address mapping table 120T may be located in a predetermined region within the NV memory element 122-1, such as a system region, but the present invention is not limited thereto. For example, the global L2P address mapping table 120T may be divided into a plurality of local L2P address mapping tables, and the local L2P address mapping tables may be stored in one or more of the NV memory elements 122-1, 122-2, . . . , and 122-$N_E$, and more particularly, may be stored in the NV memory elements 122-1, 122-2, . . . , and 122-$N_E$, respectively. When there is a needed, the memory controller 110 may load at least one portion (e.g., a portion or all) of the global L2P address mapping table 120T into the RAM 116 or other memories. For example, the memory controller 110 may load a local L2P address mapping table among the plurality of local L2P address mapping tables into the RAM 116 to be a temporary L2P address mapping table 116T, for accessing data in the NV memory 120 according to the local L2P address mapping table which is stored as the temporary L2P address mapping table 116T, but the present invention is not limited thereto.

In addition, the aforementioned at least one NV memory element (e.g., the one or more NV memory elements such as the NV memory elements {122-1, 122-2, ..., 122-$N_E$}) may comprise a plurality of blocks, where the minimum unit that the memory controller 110 may perform operations of erasing data on the NV memory 120 may be a block, and the minimum unit that the memory controller 110 may perform operations of writing data on the NV memory 120 may be a page, but the present invention is not limited thereto. For example, any NV memory element 122-$n$ (where "n" may represent any integer in the interval [1, $N_E$]) among the NV memory elements 122-1, 122-2, ..., and 122-$N_E$ may comprise multiple blocks, and a block within the multiple blocks may comprise and record a specific number of pages, where the memory controller 110 may access a certain page of a certain block within the multiple blocks according to a block address and a page address.

Figure 2:
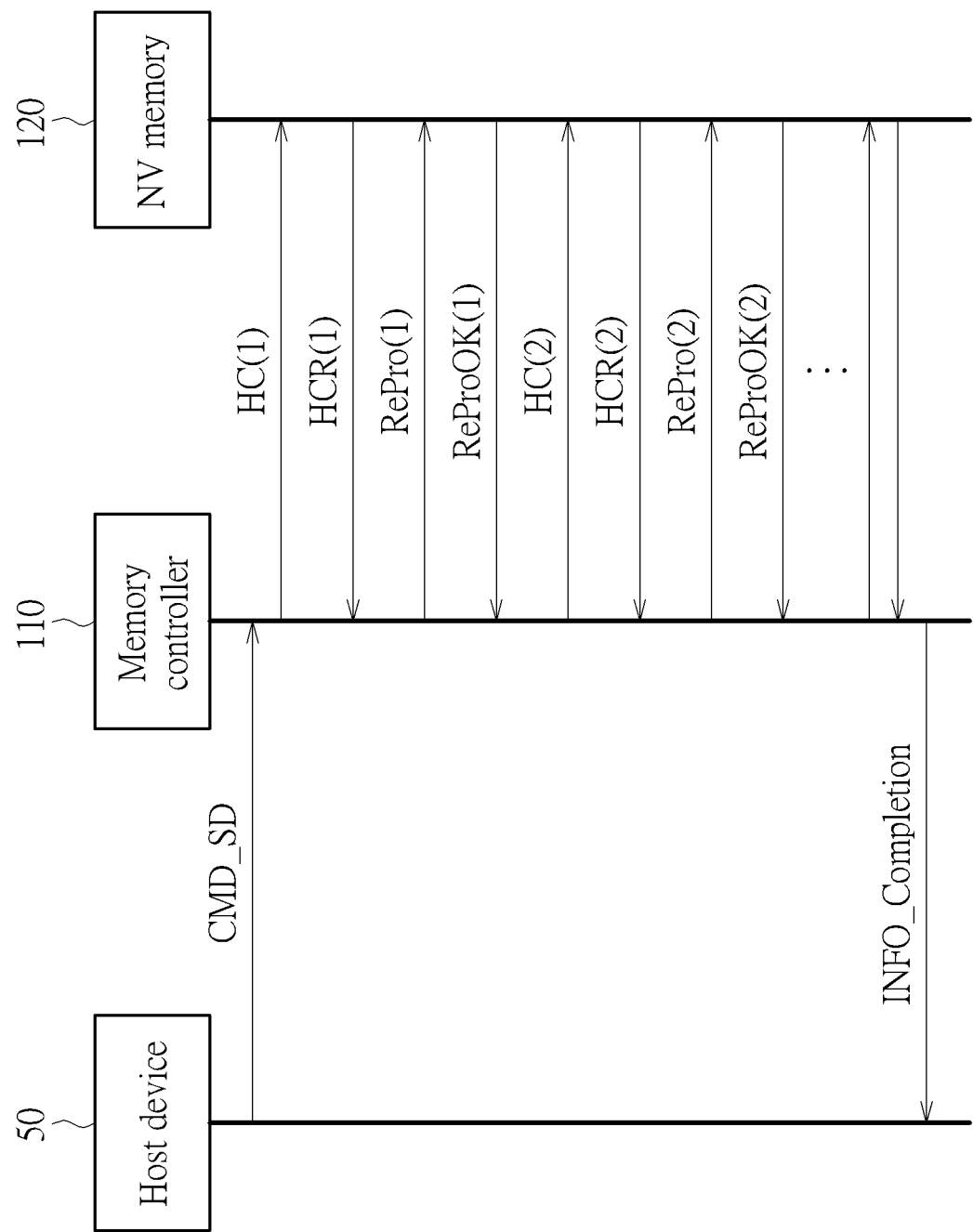
FIG. 2 illustrates a re-programming control scheme of a method for performing data retention management of a memory device with aid of pre-shutdown control according to an embodiment of the present invention.

FIG. 2 illustrates a re-programming control scheme of a method for performing data retention management of a memory device (e.g., the memory device 100) with aid of pre-shutdown control according to an embodiment of the present invention. As shown in the upper left of FIG. 2, the memory controller 110 can receive a predetermined host command such as a shutdown command CMD_SD from the host device 50, where the predetermined host command such as the shutdown command CMD_SD may indicate that shutdown of the memory device 100 is requested. For example, the predetermined host command may carry a predetermined operation code (opcode) for indicating that the shutdown of the memory device 100 is requested, but the present invention is not limited thereto. According to some embodiments, the predetermined host command may represent a vendor-specific host command. For example, the predetermined host command such as the vendor-specific host command can be another host command that differs from the plurality of host commands mentioned above.

In addition, when receiving the shutdown command CMD_SD, the memory controller 110 can perform a re-programming procedure on the NV memory 120, for enhancing data storage reliability of the memory device 100. For example, in a situation where a data region of the NV memory 120 comprises at least one set of stored data such as a set of stored data DATA(1), the memory controller 110 may prepare at least one set of re-programming data such as a set of re-programming data DATA'(1) during the re-programming procedure, and operations of the re-programming procedure may comprise:

(1) the memory controller 110 can perform a health checking operation HC(1) on the set of stored data DATA(1) to generate a health checking result HCR(1), and obtain the health checking result HCR(1) from the NV memory 120, where the health checking result HCR(1) may indicate whether a health-related score SCR(1) of the set of stored data DATA(1) falls within a predetermined health-related score range SCRR;

(2) if the health checking result HCR(1) indicates that the health-related score SCR(1) of the set of stored data DATA(1) falls within the predetermined health-related score range SCRR, the memory controller 110 can determine to process the set of stored data DATA(1) in the re-programming procedure, otherwise, in a situation where the health checking result HCR(1) indicates that the health-related score SCR(1) of the set of stored data DATA(1) does not fall within the predetermined health-related score range SCRR, the memory controller 110 can determine to prevent processing the set of stored data DATA(1) in the re-programming procedure;

(3) in response to the health checking result HCR(1) indicating that the health-related score SCR(1) of the set of stored data DATA(1) falls within the predetermined health-related score range SCRR, the memory controller 110 can process the set of stored data DATA(1), and more particularly, perform a re-programming operation RePro(1) on the set of stored data DATA(1), for example, by reading the set of stored data DATA(1) from a source location within the aforementioned at least one NV memory element (e.g., the one or more NV memory elements such as the NV memory elements {122-1, 122-2, ..., 122-$N_E$}) to prepare the set of re-programming data DATA'(1) according to the set of stored data DATA(1) and programming the set of re-programming data DATA'(1) into a destination location within the aforementioned at least one NV memory element to be replacement of the set of stored data DATA(1); and (4) after the re-programming operation RePro(1) (e.g., programming the set of re-programming data DATA'(1) into the destination location) is successful, the memory controller 110 can receive an acknowledgement ReProOK(1) of the re-programming operation RePro(1) from the NV memory 120;

where the set of re-programming data DATA'(1) can be prepared within the internal buffer 120B of the NV memory 120, and the set of stored data DATA(1) and the set of re-programming data DATA'(1) can be equivalent to each other, but the present invention is not limited thereto.

According to this embodiment, the aforementioned at least one set of stored data (e.g., the set of stored data DATA(1)) is not the only data in the data region of the NV memory 120 in this embodiment, but the present invention is not limited thereto. According to some embodiments, the aforementioned at least one set of stored data (e.g., the set of stored data DATA(1)) can be the only data in the data region of the NV memory 120, and therefore, the subsequent interactions between the memory controller 110 and the NV memory 120 in the re-programming procedure, such as at least one set of subsequent interactions (e.g., one or more sets of subsequent interactions) coming after the first set of interactions regarding the health checking operation HC(1), the health checking result HCR(1), the re-programming operation RePro(1) and the acknowledgement ReProOK(1), can be removed from FIG. 2.

In a situation where the data region of the NV memory 120 further comprises at least one set of other stored data such as a set of stored data DATA(2), the memory controller 110 may prepare at least one set of other re-programming data such as a set of re-programming data DATA'(2) during the re-programming procedure, and the operations of the re-programming procedure may further comprise:

(1) the memory controller 110 can perform a health checking operation HC(2) on the set of stored data DATA(2) to generate a health checking result HCR(2), and obtain the health checking result HCR(2) from the NV memory 120, where the health checking result HCR(2) may indicate whether a health-related score SCR(2) of the set of stored data DATA(2) falls within the predetermined health-related score range SCRR;

(2) if the health checking result HCR(2) indicates that the health-related score SCR(2) of the set of stored data DATA(2) falls within the predetermined health-related score range SCRR, the memory controller 110 can determine to process the set of stored data DATA(2) in the re-programming procedure, otherwise, in a situation where the health checking result HCR(2) indicates that the health-related score SCR(2) of the set of stored data DATA(2) does not fall within the predetermined health-related score range SCRR, the memory controller 110 can determine to prevent processing the set of stored data DATA(2) in the re-programming procedure;

(3) in response to the health checking result HCR(2) indicating that the health-related score SCR(2) of the set of stored data DATA(2) falls within the predetermined health-related score range SCRR, the memory controller 110 can process the set of stored data DATA (2), and more particularly, perform a re-programming operation RePro(2) on the set of stored data DATA(2), for example, by reading the set of stored data DATA(2) from another source location within the aforementioned at least one NV memory element (e.g., the one or more NV memory elements such as the NV memory elements {122-1, 122-2, ..., 122-$N_E$}) to prepare the set of re-programming data DATA'(2) according to the set of stored data DATA(2) and programming the set of re-programming data DATA'(2) into another destination location within the aforementioned at least one NV memory element to be replacement of the set of stored data DATA(2); and (4) after the re-programming operation RePro(2) (e.g., programming the set of re-programming data DATA'(2) into the destination location) is successful, the memory controller 110 can receive an acknowledgement ReProOK(2) of the re-programming operation RePro (2) from the NV memory 120;

where the set of re-programming data DATA'(2) can be prepared within the internal buffer 120B of the NV memory 120, and the set of stored data DATA(2) and the set of re-programming data DATA'(2) can be equivalent to each other, but the present invention is not limited thereto.

Additionally, the memory controller 110 can complete all of the operations of the re-programming procedure for all stored data in the data region of the NV memory 120, and more particularly, complete the first set of interactions regarding the health checking operation HC(1), the health checking result HCR(1), the re-programming operation RePro(1) and the acknowledgement ReProOK(1), as well as the aforementioned at least one set of subsequent interactions (e.g., the one or more sets of subsequent interactions) coming after the first set of interactions, and therefore determine that the re-programming procedure is completed. After the re-programming procedure is completed, the memory controller 110 can send completion information INFO_Completion of the predetermined host command to the host device 50, to allow the host device 50 to trigger the shutdown of the memory device 100.

Figure 3:
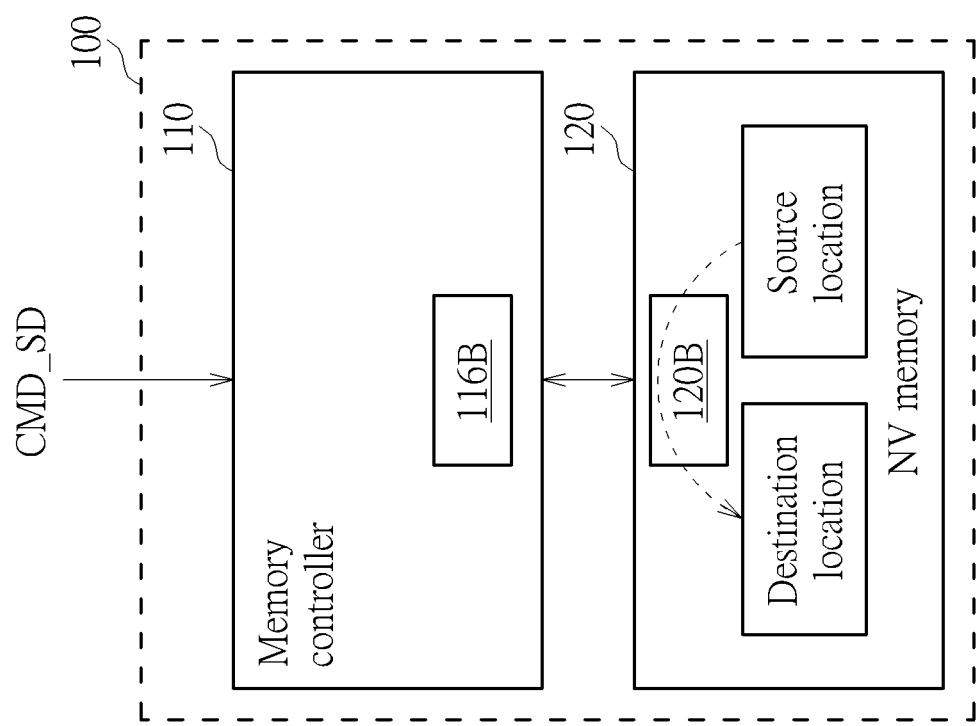
FIG. 3 illustrates some implementation details of the re-programming control scheme shown in FIG. 2 according to an embodiment of the present invention.

FIG. 3 illustrates some implementation details of the re-programming control scheme shown in FIG. 2 according to an embodiment of the present invention. For example, the at least one set of re-programming data (e.g., the set of re-programming data DATA'(1)) can be prepared within the internal buffer 120B of the NV memory 120, and the at least one set of stored data (e.g., the set of stored data DATA(1)) and the at least one set of re-programming data (e.g., the set of re-programming data DATA'(1)) can be equivalent to each other. For another example, the at least one set of other re-programming data (e.g., the set of re-programming data DATA'(2)) can be prepared within the internal buffer 120B of the NV memory 120, and the at least one set of other stored data (e.g., the set of stored data DATA(2)) and the at least one set of other re-programming data (e.g., the set of re-programming data DATA'(2)) can be equivalent to each other.

For better comprehension, the memory controller 110 can send at least one memory operating command (e.g., one or more memory operating commands) such as a predetermined memory operating command to the NV memory 120 to trigger at least one internal copy operation (e.g., one or more internal copy operations) of the NV memory 120, to control the NV memory 120 to copy one or more sets of stored data from one or more source locations within the NV memory 120 to one or more destination locations within the NV memory 120. During the re-programming procedure, the memory controller 110 can trigger a first internal copy operation among the at least one internal copy operation of the NV memory 120, to control the NV memory 120 to read the at least one set of stored data (e.g., the set of stored data DATA(1)) from a first source location among the one or more source locations of the NV memory 120, buffer the at least one set of stored data (e.g., the set of stored data DATA(1)) in the internal buffer 120B of the NV memory 120 to be the at least one set of re-programming data (e.g., the set of re-programming data DATA'(1)), and program the at least one set of re-programming data (e.g., the set of re-programming data DATA'(1)) into a first destination location among the one or more destination locations of the NV memory 120. Similarly, during the re-programming procedure, the memory controller 110 can trigger a second internal copy operation among the at least one internal copy operation of the NV memory 120, to control the NV memory 120 to read the at least one set of other stored data (e.g., the set of stored data DATA(2)) from a second source location among the one or more source locations of the NV memory 120, buffer the at least one set of other stored data (e.g., the set of stored data DATA(2)) in the internal buffer 120B of the NV memory 120 to be the at least one set of other re-programming data (e.g., the set of re-programming data DATA'(2)), and program the at least one set of other re-programming data (e.g., the set of re-programming data DATA'(2)) into a second destination location among the one or more destination locations of the NV memory 120. As a result, the at least one set of stored data (e.g., the set of stored data DATA(1)) and the at least one set of re-programming data (e.g., the set of re-programming data DATA'(1)) can be equivalent to each other, and the at least one set of other stored data (e.g., the set of stored data DATA(2)) and the at least one set of other re-programming data (e.g., the set of re-programming data DATA'(2)) can be equivalent to each other. For brevity, similar descriptions for this embodiment are not repeated in detail here.

Figure 4:
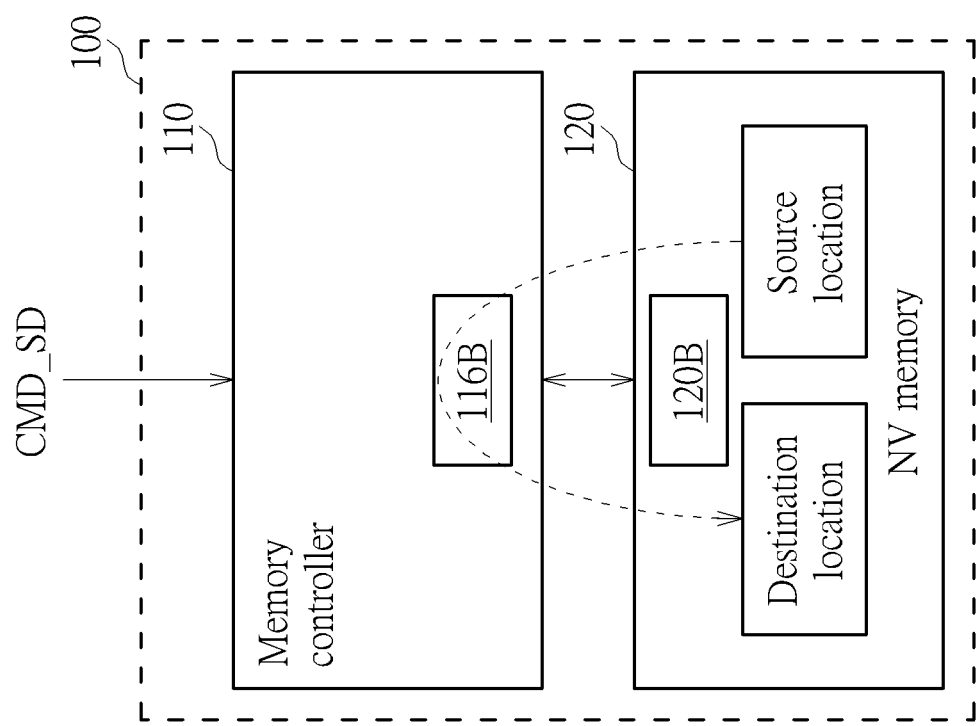
FIG. 4 illustrates some implementation details of the re-programming control scheme shown in FIG. 2 according to another embodiment of the present invention.

FIG. 4 illustrates some implementation details of the re-programming control scheme shown in FIG. 2 according to another embodiment of the present invention. For example, the at least one set of re-programming data (e.g., the set of re-programming data DATA'(1)) can be prepared outside the NV memory 120, and more particularly, can be prepared within the buffer 116B of the memory controller 110. For another example, the at least one set of other re-programming data (e.g., the set of re-programming data DATA'(2)) can be prepared outside the NV memory 120, and more particularly, can be prepared within the buffer 116B of the memory controller 110.

For better comprehension, the seeds used for randomizing non-randomized data (e.g., the aforementioned encoded data of the write data) to generate the randomized data (e.g., the set of stored data DATA(1)), such as the seeds for generating the set of stored data DATA(1) when the set of stored data DATA(1) is stored into the NV memory 120, may need to be changed during the re-programming procedure for re-randomizing the non-randomized data to generate the re-randomized data such as the set of re-programming data DATA'(1), in order to guarantee the randomness-properties of the set of re-programming data DATA'(1) prepared during the re-programming procedure, and therefore guarantee a uniform programming state distribution of any physical block storing the set of re-programming data DATA'(1) within the NV memory 120. For example, the at least one set of stored data (e.g., the set of stored data DATA(1)) may comprise, and more particularly, may be a randomized version of first non-randomized data, and the at least one set of re-programming data (e.g., the set of re-programming data DATA'(1)) may comprise, and more particularly, may be a randomized version of second non-randomized data. During the write procedure, the memory controller 110 may randomize the first non-randomized data with a set of first seeds to generate the at least one set of stored data (e.g., the set of stored data DATA(1)), and program the at least one set of stored data (e.g., the set of stored data DATA(1)) into the NV memory 120. During the re-programming procedure, the memory controller 110 may read the at least one set of stored data (e.g., the set of stored data DATA(1)) from the NV memory 120, utilize the randomizer circuit 114R (e.g., the de-randomizer therein) to de-randomize the at least one set of stored data (e.g., the set of stored data DATA(1)) to generate the corresponding de-randomized data to be the second non-randomized data, and utilize the randomizer circuit 114R (e.g., the randomizer therein) to randomize the second non-randomized data with a set of second seeds to generate the at least one set of re-programming data (e.g., the set of re-programming data DATA'(1)), and program the at least one set of re-programming data (e.g., the set of re-programming data DATA'(1)) into the NV memory 120. As a result, the first non-randomized data carried by the at least one set of stored data (e.g., the set of stored data DATA(1)) and the second non-randomized data carried by the at least one set of re-programming data (e.g., the set of re-programming data DATA'(1)) can be equivalent to each other.

Similarly, the seeds used for randomizing non-randomized data (e.g., the aforementioned encoded data of the write data) to generate the randomized data (e.g., the set of stored data DATA(2)), such as the seeds for generating the set of stored data DATA(2) when the set of stored data DATA(2) is stored into the NV memory 120, may need to be changed during the re-programming procedure for re-randomizing the non-randomized data to generate the re-randomized data such as the set of re-programming data DATA'(2), in order to guarantee the randomness-properties of the set of re-programming data DATA'(2) prepared during the re-programming procedure, and therefore guarantee a uniform programming state distribution of any physical block storing the set of re-programming data DATA'(2) within the NV memory 120. For example, the at least one set of other stored data (e.g., the set of stored data DATA(2)) may comprise, and more particularly, may be a randomized version of third non-randomized data, and the at least one set of other re-programming data (e.g., the set of re-programming data DATA'(2)) may comprise, and more particularly, may be a randomized version of fourth non-randomized data. During the write procedure, the memory controller 110 may randomize the third non-randomized data with a set of third seeds to generate the at least one set of other stored data (e.g., the set of stored data DATA(2)), and program the at least one set of other stored data (e.g., the set of stored data DATA(2)) into the NV memory 120. During the re-programming procedure, the memory controller 110 may read the at least one set of other stored data (e.g., the set of stored data DATA(2)) from the NV memory 120, utilize the randomizer circuit 114R (e.g., the de-randomizer therein) to de-randomize the at least one set of other stored data (e.g., the set of stored data DATA(2)) to generate the corresponding de-randomized data to be the fourth non-randomized data, and utilize the randomizer circuit 114R (e.g., the randomizer therein) to randomize the fourth non-randomized data with a set of fourth seeds to generate the at least one set of other re-programming data (e.g., the set of re-programming data DATA'(2)), and program the at least one set of other re-programming data (e.g., the set of re-programming data DATA'(2)) into the NV memory 120. As a result, the third non-randomized data carried by the at least one set of other stored data (e.g., the set of stored data DATA(2)) and the fourth non-randomized data carried by the at least one set of other re-programming data (e.g., the set of re-programming data DATA'(2)) can be equivalent to each other. For brevity, similar descriptions for this embodiment are not repeated in detail here.

According to some embodiments, the at least one set of re-programming data (e.g., the set of re-programming data DATA'(1)) can be prepared within the internal buffer 120B of the NV memory 120, and the at least one set of stored data (e.g., the set of stored data DATA(1)) and the at least one set of re-programming data (e.g., the set of re-programming data DATA'(1)) can be equivalent to each other, where the at least one set of other re-programming data (e.g., the set of re-programming data DATA'(2)) can be prepared outside the NV memory 120, and more particularly, can be prepared within the buffer 116B of the memory controller 110, but the present invention is not limited thereto. For brevity, similar descriptions for these embodiments are not repeated in detail here.

According to some embodiments, the at least one set of other re-programming data (e.g., the set of re-programming data DATA'(2)) can be prepared within the internal buffer 120B of the NV memory 120, and the at least one set of other stored data (e.g., the set of stored data DATA(2)) and the at least one set of other re-programming data (e.g., the set of re-programming data DATA'(2)) can be equivalent to each other, where the at least one set of re-programming data (e.g., the set of re-programming data DATA'(1)) can be prepared outside the NV memory 120, and more particularly, can be prepared within the buffer 116B of the memory controller 110, but the present invention is not limited thereto. For brevity, similar descriptions for these embodiments are not repeated in detail here.

Figure 5:
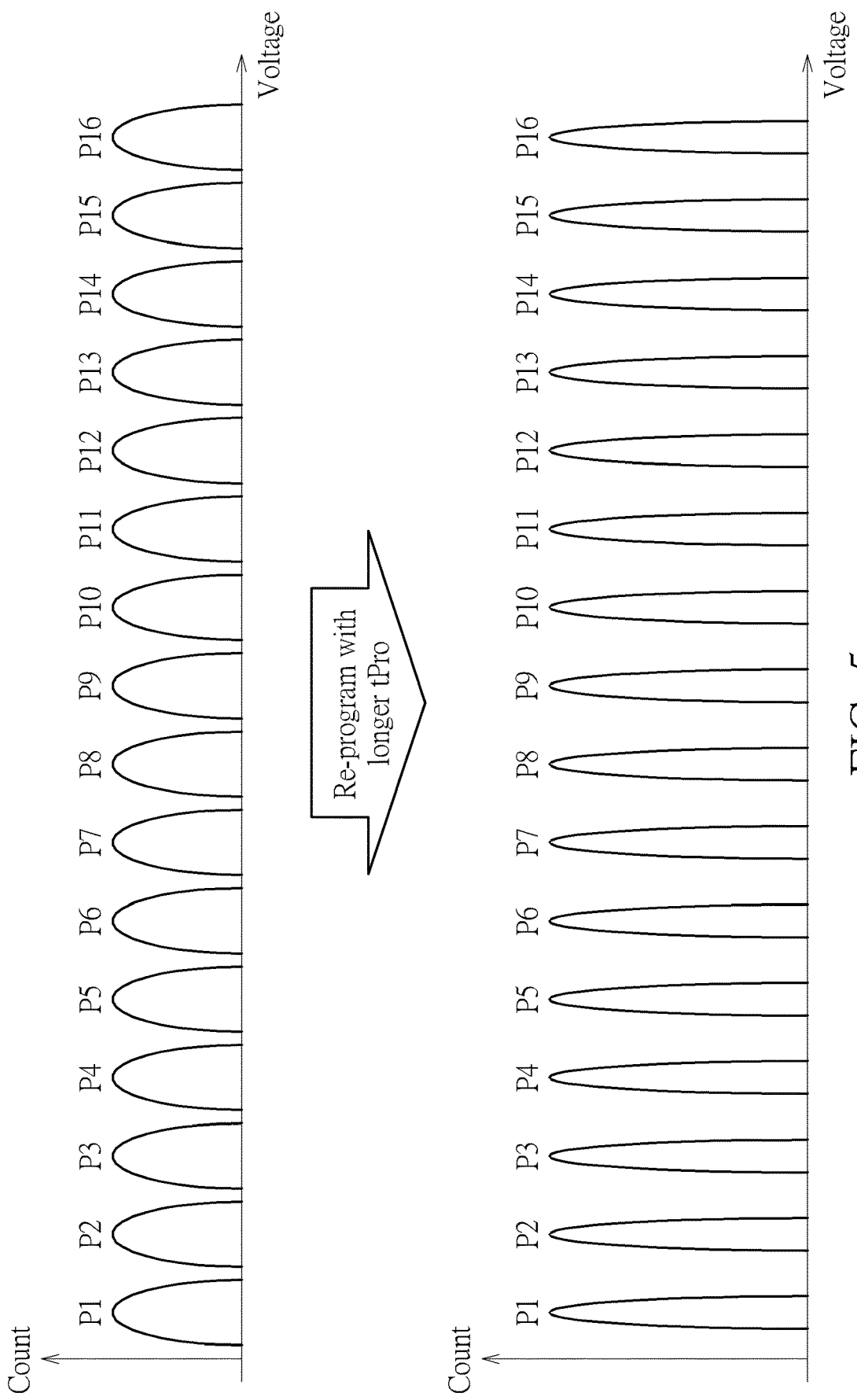
FIG. 5 illustrates, in the lower half thereof, an example of a new programming state distribution of at least one physical block within a data region of the NV memory in a situation where the re-programming control scheme shown in FIG. 2 is applied to the memory device shown in FIG. 1, where an example of an original programming state distribution is also illustrated in the upper half of FIG. 5 for better comprehension.

FIG. 5 illustrates, in the lower half thereof, an example of a new programming state distribution of at least one physical block (e.g., one or more physical blocks) within the data region of the NV memory 120 in a situation where the re-programming control scheme shown in FIG. 2 is applied to the memory device 100 shown in FIG. 1, where an example of an original programming state distribution is also illustrated in the upper half of FIG. 5 for better comprehension. For example, the at least one physical block within the data region of the NV memory 120 may represent at least one quadruple level cell (QLC) block (e.g., one or more QLC blocks), and the number of programming states may be equal to sixteen, but the present invention is not limited thereto. In addition, in any programming state distribution among the two programming state distributions (e.g., the original programming state distribution shown in the upper half of FIG. 5 and the new programming state distribution shown in the lower half of FIG. 5), the horizontal axis may represent the voltage such as a threshold voltage for sensing bit information in a memory cell, and the vertical axis may represent the count such as the memory cell count of all memory cells in the at least one physical block (e.g., the at least one QLC block).

As shown in the upper half of FIG. 5, the programming states P1, P2, P3, P4, P5, P6, P7, P8, P9, P10, P11, P12, P13, P14, P15 and P16 in the at least one QLC block can be very uniform, where the seeds used by the randomizer circuit 114R (e.g., the randomizer therein) can be properly prepared according to at least one predetermined rule in advance, to guarantee the randomness-properties of all data in the at least one QLC block, and therefore make the programming states P1, P2, P3, P4, P5, P6, P7, P8, P9, P10, P11, P12, P13, P14, P15 and P16 in the at least one QLC block be very uniform. For example, the memory controller 110 (e.g., the microprocessor 112) can prepare the seeds for the randomizer circuit 114R (e.g., the randomizer therein), but the present invention is not limited thereto. For another example, another device such as a production tool can prepare the seeds for the memory device 100, and write the seeds into the NV memory 120 (e.g., the system region within the NV memory 120) through the memory controller 110, and the memory controller 110 (e.g., the microprocessor 112) can load the seeds from the NV memory 120 (e.g., the system region within the NV memory 120), for being used by the randomizer circuit 114R (e.g., the randomizer therein).

As shown in the lower half of FIG. 5, the programming states P1, P2, P3, P4, P5, P6, P7, P8, P9, P10, P11, P12, P13, P14, P15 and P16 can still be very uniform, and more particularly, can be very elongated, respectively, where the memory controller 110 (e.g., the microprocessor 112) can perform the re-programming procedure on the NV memory 120 to make the programming states P1, P2, P3, P4, P5, P6, P7, P8, P9, P10, P11, P12, P13, P14, P15 and P16 become more elongated, respectively. The memory controller 110 can re-program at least one portion (e.g., a portion or all) of the stored data in the NV memory 120 with a longer programming time tPro (labeled "Re-program with longer tPro" for brevity), to guarantee the discreteness of the programming states P1, P2, P3, P4, P5, P6, P7, P8, P9, P10, P11, P12, P13, P14, P15 and P16. For example, during the write procedure, the memory controller 110 (e.g., the microprocessor 112) can perform programming operations on the NV memory 120 with the programming time tPro being set as a default value such as a first predetermined programming time tPro(1). For another example, during the re-programming procedure, the memory controller 110 (e.g., the microprocessor 112) can perform programming operations on the NV memory 120 with the programming time tPro being set as a special value such as a second predetermined programming time tPro(2), where the special value is greater than the default value (e.g., tPro(2)>tPro(1)). Therefore, the memory controller 110 can use the default value such as the first predetermined programming time tPro(1) to achieve a shorter overall programming time in the write procedure, in order to guarantee that the write operations can be completed in time and bring better user experience to the user, and can use the special value such as the second predetermined programming time tPro(2) to achieve the high degree of discreteness of the programming states P1, P2, P3, P4, P5, P6, P7, P8, P9, P10, P11, P12, P13, P14, P15 and P16, in order to guarantee the high degree of data storage reliability of the memory device 100 and fight against a possible degrading effect of the programming states P1, P2, P3, P4, P5, P6, P7, P8, P9, P10, P11, P12, P13, P14, P15 and P16 (e.g., an effect that these programming states change and mix with one another) with respect to time. For brevity, similar descriptions for this embodiment are not repeated in detail here.

According to some embodiments, the type of the at least one physical block may vary. For example, the at least one physical block may represent at least one triple level cell (TLC) block (e.g., one or more TLC blocks), and the number of programming states may become eight. For another example, the at least one physical block may represent at least one single level cell (SLC) block (e.g., one or more SLC blocks), and the number of programming states may become two. In some examples, the at least one physical block may represent at least one multiple level cell (MLC) block, and the number of programming states may become four for a narrow definition of MLC (e.g., two bits per memory cell), or may be at least four for a broad definition of MLC (e.g., at least two bits per memory cell). For brevity, similar descriptions for these embodiments are not repeated in detail here.

Figure 6:
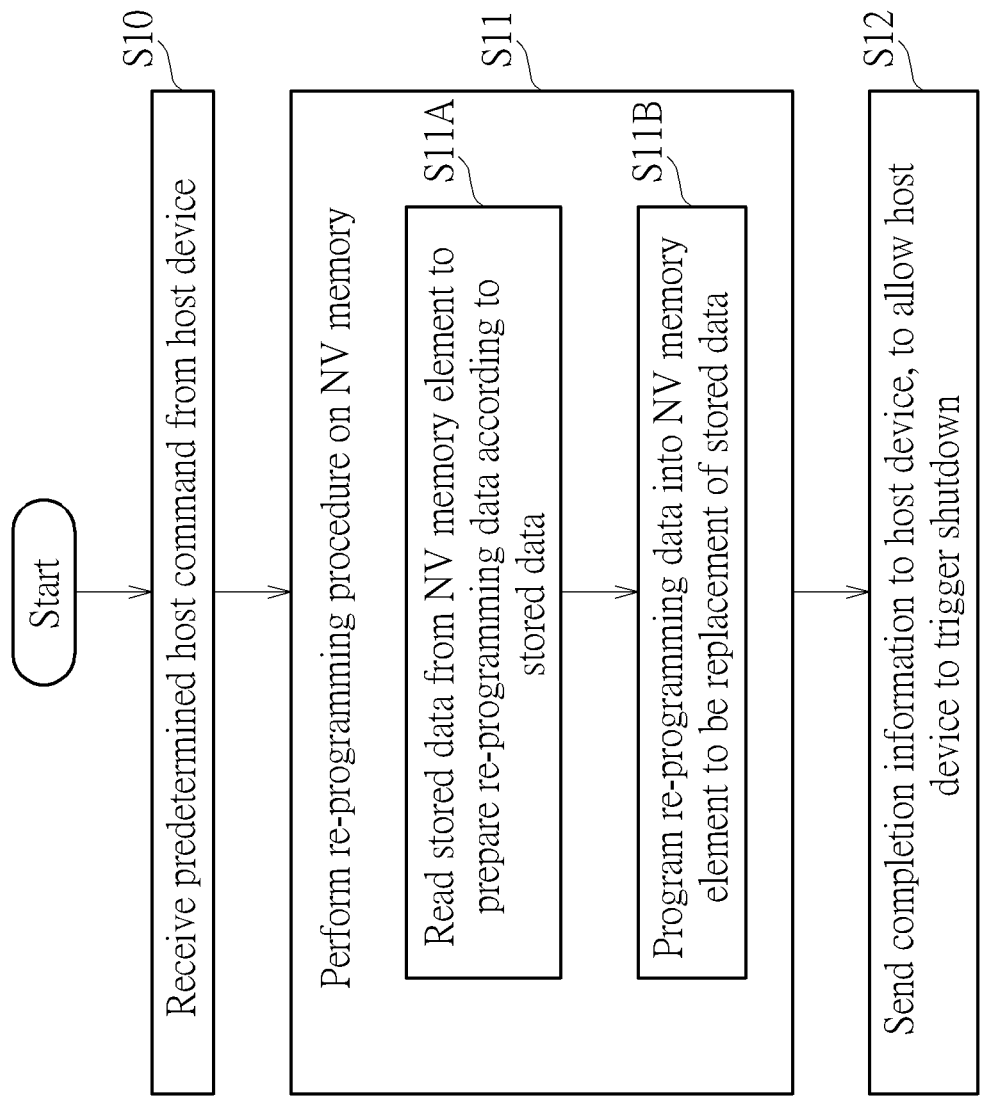
FIG. 6 is a flowchart of the method according to an embodiment of the present invention.

FIG. 6 is a flowchart of the method according to an embodiment of the present invention, where the method can be applied to the memory device 100 shown in FIG. 1, and more particularly, the memory controller 110 and the components thereof.

In Step S10, the memory device 100 (e.g., the memory controller 110) can receive the predetermined host command such as the shutdown command CMD_SD from the host device 50, where the predetermined host command such as the shutdown command CMD_SD can indicate that the shutdown of the memory device 100 is requested.

In Step S11, in response to the predetermined host command such as the shutdown command CMD_SD, the memory device 100 (e.g., the memory controller 110) can perform the re-programming procedure on the NV memory 120, for enhancing the data storage reliability of the memory device 100. For example, the re-programming procedure may comprise the operations of Steps S11A and S11B.

In Step S11A, the memory device 100 (e.g., the memory controller 110) can read at least one set of stored data DATA(i) (e.g., one or more sets of stored data, such as the sets of stored data DATA(1) and DATA(2)) from the aforementioned at least one NV memory element (e.g., the one or more NV memory elements such as the NV memory elements $\{122\text{-}1, 122\text{-}2, \ldots, 122\text{-}N_E\}$), and more particularly, read the at least one set of stored data DATA(i) from at least one source location Loc_s(i) (e.g., one or more source locations, such as the source locations Loc_s(1) and Loc_s (2)) within the aforementioned at least one NV memory element, to prepare at least one set of re-programming data DATA'(i) (e.g., one or more sets of re-programming data, such as the sets of re-programming data DATA'(1) and DATA'(2)) according to the at least one set of stored data DATA(i), where the at least one set of stored data DATA(i) is stored at the at least one source location Loc_s(i) before the re-programming procedure is performed. For example, the index i can be a positive integer falling within the range of the interval [1, i_max], and the maximum index value i_max of the index i can be an integer greater than one, but the present invention is not limited thereto. For another example, the at least one set of stored data DATA(i) (e.g., the set of stored data DATA(1)) can be the only data in the data region of the NV memory 120, and therefore, the index i can be equal to one.

In Step S11B, the memory device 100 (e.g., the memory controller 110) can program the at least one set of re-programming data DATA'(i) into the aforementioned at least one NV memory element (e.g., the one or more NV memory elements such as the NV memory elements {122-1, 122-2, . . . , 122-N$_E$}), and more particularly, program the at least one set of re-programming data DATA'(i) into at least one destination location Loc_d(i) (e.g., one or more destination locations, such as the destination locations Loc_d(1) and Loc_d(2)) within the aforementioned at least one NV memory element, to be replacement of the at least one set of stored data DATA(i).

For example, the size of the at least one set of re-programming data DATA'(i) may be equal to that of one page, and the size of the at least one set of stored data DATA(i) may also be equal to that of one page, where the at least one source location Loc_s(i) and at least one destination location Loc_d(i) may represent a physical page having a physical page address (PPA) PPA_s(i) and a physical page having a PPA PPA_d(i), respectively, but the present invention is not limited thereto. For another example, the size of the at least one set of re-programming data DATA'(i) and the size of the at least one set of stored data DATA(i) may vary. According to some embodiments, the size of the at least one set of re-programming data DATA'(i) may be equal to that of one block, and the size of the at least one set of stored data DATA(i) may also be equal to that of one block, where the at least one source location Loc_s(i) and at least one destination location Loc_d(i) may represent a physical block having a physical block address (PBA) PBA_s(i) and a physical block having a PBA PBA_d(i), respectively.

In Step S12, in response to the re-programming procedure being completed, the memory device 100 (e.g., the memory controller 110) can send the completion information INFO_Completion of the predetermined host command to the host device 50, for indicating that the memory device 100 (e.g., the memory controller 110) has completed all preparation operations in response to the predetermined host command, to allow the host device 50 to trigger the shutdown of the memory device 100. For brevity, similar descriptions for this embodiment are not repeated in detail here.

For better comprehension, the method may be illustrated with the working flow shown in FIG. 6, but the present invention is not limited thereto. According to some embodiments, one or more steps may be added, deleted, or changed in the working flow shown in FIG. 6. For example, the memory controller 110 can determine whether the at least one set of stored data DATA(i) (e.g., the one or more sets of stored data, such as the sets of stored data DATA(1) and DATA(2)) should be processed in the re-programming procedure according to at least one health checking result HCR(i) (e.g., one or more health checking results, such as the health checking results HCR(1) and HCR(2)) of the at least one set of stored data DATA(i), and the operations of the re-programming procedure may comprise:

(1) the memory controller 110 can perform at least one health checking operation HC(i) (e.g., one or more health checking operations, such as the health checking operations HC(1) and HC(2)) on the at least one set of stored data DATA(i) to generate the at least one health checking result HCR(i), where the at least one health checking result HCR(i) may indicate whether a health-related score SCR(i) (e.g., one or more health-related scores, such as the health-related scores SCR(1) and SCR(2)) of the at least one set of stored data DATA(i) falls within the predetermined health-related score range SCRR; and (2) if the at least one health checking result HCR(i) indicates that the health-related score SCR(i) of the at least one set of stored data DATA(i) falls within the predetermined health-related score range SCRR, the memory controller 110 can determine to process the at least one set of stored data DATA(i) in the re-programming procedure, otherwise, in a situation where the at least one health checking result HCR(i) indicates that the health-related score SCR(i) of the at least one set of stored data DATA(i) does not fall within the predetermined health-related score range SCRR, the memory controller 110 can determine to prevent processing the at least one set of stored data DATA(i) in the re-programming procedure. For brevity, similar descriptions for these embodiments are not repeated in detail here.

According to some embodiments, the memory controller 110 can determine the health-related score SCR(i) (e.g., the one or more health-related scores, such as the health-related scores SCR(1) and SCR(2)) according to a read count CNT_r(i) of the at least one source location Loc_s(i) where the at least one set of stored data DATA(i) is stored, and more particularly, can use the read count CNT_r(i) as the health-related score SCR(i), and use the range of the interval [CNT_r_Th, ∞) defined with a predetermined read count threshold CNT_r_Th as the predetermined health-related score range SCRR. For example, the memory controller 110 can maintain a read count table within the NV memory 120 (e.g., the system region), and record the respective read counts of multiple storage locations (e.g., PBAs and/or PPAs) within the NV memory 120 into the read count table in response to multiple read operations performed on the NV memory 120. As a result, the at least one source location Loc_s(i) can be at least one storage location among the multiple storage locations, and the read count CNT_r(i) can be the read count of the at least one storage location as recorded in the read count table. In addition, the operations of the re-programming procedure may comprise:

(1) when determining the health-related score SCR(i) such as the read count CNT_r(i), the memory controller 110 can read the read count of the at least one storage location among the multiple storage locations from the read count table to be the read count CNT_r(i) of the at least one source location Loc_s(i);

(2) the memory controller 110 can determine whether the health-related score SCR(i) such as the read count CNT_r(i) falls within the predetermined health-related score range SCRR such as the range of the interval [CNT_r_Th, ∞), to determine whether to process the at least one set of stored data DATA(i) in the re-programming procedure; and (3) if the read count CNT_r(i) falls within the range of the interval [CNT_r_Th, ∞) (i.e., CNT_r(i)≥CNT_r_Th), the memory controller 110 can determine to process the at least one set of stored data DATA(i) in the re-programming procedure, otherwise, in a situation where the read count CNT_r(i) does not fall within the range of the interval [CNT_r_Th, ∞) (i.e., CNT_r(i)<CNT_r_Th), the memory controller 110 can determine to prevent processing the at least one set of stored data DATA(i) in the re-programming procedure, but the present invention is not limited thereto. For brevity, similar descriptions for these embodiments are not repeated in detail here.

According to some embodiments, implementation of the health-related score SCR(i) and the predetermined health-related score range SCRR may vary. For example, the memory controller 110 can determine the health-related score SCR(i) according to an error count CNT_err(i) of the at least one set of stored data DATA(i), and more particularly, can use the error count CNT_err(i) as the health-related score SCR(i), and use the range of the interval [CNT_err_Th, ∞) defined with a predetermined error count threshold CNT_err_Th as the predetermined health-related score range SCRR, where the error count CNT_err(i) and the predetermined error count threshold CNT_err_Th can replace the read count CNT_r(i) and the predetermined read count threshold CNT_r_Th in the above operations of the re-programming procedure, respectively. For another example, the memory controller 110 can determine the health-related score SCR(i) according to an error rate RATE_err(i) of the at least one set of stored data DATA(i), and more particularly, can use the error rate RATE_err(i) as the health-related score SCR(i), and use the range of the interval [RATE_err_Th, ∞) defined with a predetermined error rate threshold RATE_err_Th as the predetermined health-related score range SCRR, where the error rate RATE_err(i) and the predetermined error rate threshold RATE_err_Th can replace the read count CNT_r(i) and the predetermined read count threshold CNT_r_Th in the above operations of the re-programming procedure, respectively. For brevity, similar descriptions for these embodiments are not repeated in detail here.

According to some embodiments, the memory controller 110 can determine the health-related score SCR(i) (e.g., the one or more health-related scores, such as the health-related scores SCR(1) and SCR(2)) according to one or a combination of the read count CNT_r(i) of the at least one source location Loc_s(i) where the at least one set of stored data DATA(i) is stored, the error count CNT_err(i) of the at least one set of stored data DATA(i), and the error rate RATE_err(i) of the at least one set of stored data DATA(i). For brevity, similar descriptions for these embodiments are not repeated in detail here.

Figure 7:
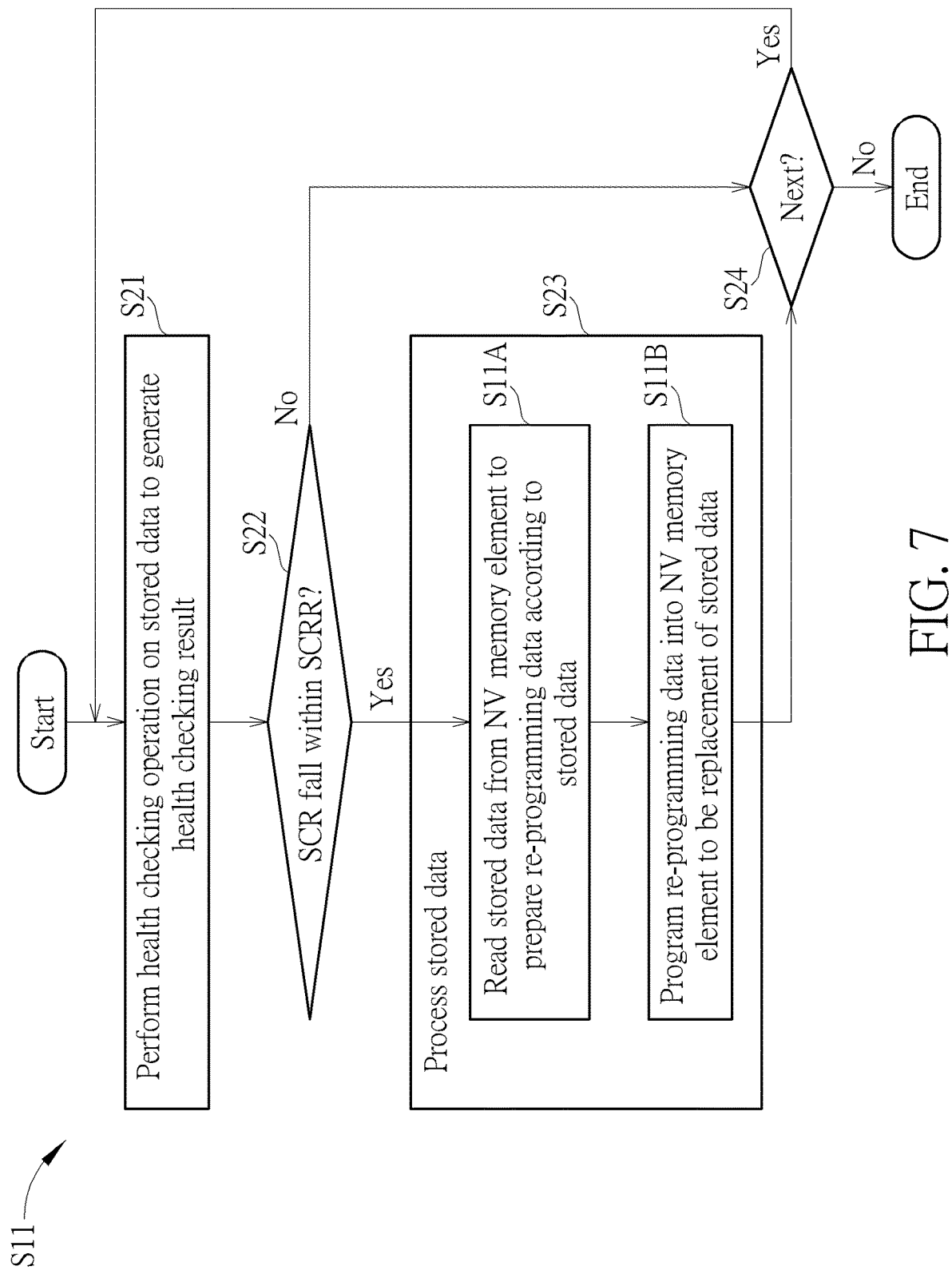
FIG. 7 illustrates a working flow of the method according to an embodiment of the present invention, where some operations of the working flow shown in FIG. 7 can be taken as examples of that in a partial working flow shown in FIG. 6.

FIG. 7 illustrates a working flow of the method according to an embodiment of the present invention, where some operations of the working flow shown in FIG. 7 can be taken as examples of that in a partial working flow shown in FIG. 6. For example, the operations of the re-programming procedure mentioned in Step S11 shown in FIG. 6 may comprise the operations of Steps S21-S24 shown in FIG. 7, and the start node and the end node (respectively labeled "Start" and "End" for brevity) of the working flow shown in FIG. 7 may represent "From Step S10" and "To Step S12" respectively.

In Step S21, the memory device 100 (e.g., the memory controller 110) can perform the at least one health checking operation HC(i) on the at least one set of stored data DATA(i) to generate the at least one health checking result HCR(i), where the at least one health checking result HCR(i) may indicate whether the health-related score SCR(i) of the at least one set of stored data DATA(i) falls within the predetermined health-related score range SCRR.

In Step S22, the memory device 100 (e.g., the memory controller 110) can determine whether the health-related score SCR(i) of the at least one set of stored data DATA(i) falls within the predetermined health-related score range SCRR (labeled "SCR fall within SCRR" for brevity). If Yes, Step S23 is entered (e.g., the memory controller 110 determines to process the at least one set of stored data DATA(i) in the re-programming procedure); if No, Step S24 is entered (e.g., the memory controller 110 determines to prevent processing the at least one set of stored data DATA(i) in the re-programming procedure).

In Step S23, the memory device 100 (e.g., the memory controller 110) can process the at least one set of stored data DATA(i). For example, processing the at least one set of stored data DATA(i) may comprise the operations of Steps S11A and S11B.

In Step S24, the memory device 100 (e.g., the memory controller 110) can determine whether a next set of stored data such as at least one set of stored data DATA(i+1) exists (labeled "Next" for brevity). If Yes, Step S21 is entered, where the index i can be increased with a predetermined increment such as one (e.g., an operation of i++, such as an increment operation performed on the index i by adding one to the index i); if No, the working flow shown in FIG. 7 comes to the end. For brevity, similar descriptions for this embodiment are not repeated in detail here.

For better comprehension, the method may be illustrated with the working flow shown in FIG. 7, but the present invention is not limited thereto. According to some embodiments, one or more steps may be added, deleted, or changed in the working flow shown in FIG. 7.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for performing data retention management of a memory device with aid of pre-shutdown control, the method being applied to a memory controller of the memory device, the memory device comprising the memory controller and a non-volatile (NV) memory, the NV memory comprising at least one NV memory element, the method comprising:

receiving a predetermined host command from a host device, wherein the predetermined host command indicates that shutdown of the memory device is requested;

in response to the predetermined host command, performing a re-programming procedure on the NV memory, for enhancing data storage reliability of the memory device, wherein the re-programming procedure comprises:

performing at least one health checking operation on at least one set of stored data from at least one source location within the at least one NV memory element to generate at least one health checking result, wherein the at least one health checking result indicates whether a health-related score of the at least one set of stored data falls within a predetermined health-related score range;

in response to the at least one health checking result indicating that the health-related score of the at least one set of stored data falls within the predetermined health-related score range, determining to process the at least one set of stored data in the re-programming procedure by reading the at least one set of stored data from at least one source location within the at least one NV memory element and preparing at least one set of re-programming data according to the at least one set of stored data, wherein the at least one set of stored data is stored at the at least one source location before the re-programming procedure is performed; and programming the at least one set of re-programming data into at least one destination location within the at least one NV memory element to be replacement of the at least one set of stored data, wherein the at least one set of re-programming data is programmed into the at least one destination location with a different programming time from a programing time of the at least one set of stored data at the at least one source location; and in response to the re-programming procedure being completed, sending completion information of the predetermined host command to the host device, to allow the host device to trigger the shutdown of the memory device.

2. The method of claim 1, wherein the predetermined host command carries a predetermined operation code for indicating that the shutdown of the memory device is requested.

3. The method of claim 1, wherein the at least one set of re-programming data is prepared within an internal buffer of the NV memory, and the at least one set of stored data and the at least one set of re-programming data are equivalent to each other.

4. The method of claim 3, wherein at least one set of other re-programming data is prepared outside the NV memory; and the re-programming procedure further comprises:

reading at least one set of other stored data from at least one other source location within the at least one NV memory element to prepare the at least one set of other re-programming data according to the at least one set of other stored data, wherein the at least one set of other stored data is stored at the at least one other source location before the re-programming procedure is performed; and programming the at least one set of other re-programming data into at least one other destination location within the at least one NV memory element to be replacement of the at least one set of other stored data.

5. The method of claim 1, wherein the at least one set of re-programming data is prepared outside the NV memory.

6. The method of claim 5, wherein at least one set of other re-programming data is prepared within an internal buffer of the NV memory; and the re-programming procedure further comprises:

reading at least one set of other stored data from at least one other source location within the at least one NV memory element to prepare the at least one set of other re-programming data according to the at least one set of other stored data, wherein the at least one set of other stored data is stored at the at least one other source location before the re-programming procedure is performed; and programming the at least one set of other re-programming data into at least one other destination location within the at least one NV memory element to be replacement of the at least one set of other stored data;

wherein the at least one set of other stored data and the at least one set of other re-programming data are equivalent to each other.

7. The method of claim 1, wherein the at least one set of stored data comprises a randomized version of first non-randomized data, and the at least one set of re-programming data comprises a randomized version of second non-randomized data; and the first non-randomized data carried by the at least one set of stored data and the second non-randomized data carried by the at least one set of re-programming data are equivalent to each other.

8. The method of claim 1, wherein the health-related score is determined according to one or a combination of a read count of the at least one source location where the at least one set of stored data is stored, an error count of the at least one set of stored data, and an error rate of the at least one set of stored data.

9. The method of claim 1, wherein whether at least one set of other stored data should be processed in the re-programming procedure is determined according to at least one other health checking result of the at least one set of other stored data; and the re-programming procedure further comprises:

performing at least one other health checking operation on the at least one set of other stored data to generate the at least one other health checking result, wherein the at least one other health checking result indicates whether a health-related score of the at least one set of other stored data falls within the predetermined health-related score range; and in response to the at least one other health checking result indicating that the health-related score of the at least one set of other stored data does not fall within the predetermined health-related score range, determining to prevent processing the at least one set of other stored data in the re-programming procedure.

10. A memory device, comprising:

a non-volatile (NV) memory, arranged to store information, wherein the NV memory comprises at least one NV memory element; and a memory controller, coupled to the NV memory, arranged to control operations of the memory device, wherein the memory controller comprises:

a processing circuit, arranged to control the memory controller according to a plurality of host commands from a host device, to allow the host device to access the NV memory through the memory controller;

wherein:

the memory controller receives a predetermined host command from the host device, wherein the predetermined host command indicates that shutdown of the memory device is requested;

in response to the predetermined host command, the memory controller performs a re-programming procedure on the NV memory, for enhancing data storage reliability of the memory device, wherein the re-programming procedure comprises:

performing at least one health checking operation on at least one set of stored data from at least one source location within the at least one NV memory element to generate at least one health checking result, wherein the at least one health checking result indicates whether a health-related score of the at least one set of stored data falls within a predetermined health-related score range;

in response to the at least one health checking result indicating that the health-related score of the at least one set of stored data falls within the predetermined health-related score range, determining to process the at least one set of stored data in the re-programming procedure by reading the at least one set of stored data from at least one source location within the at least one NV memory element and preparing at least one set of re-programming data according to the at least one set of stored data, wherein the at least one set of stored data is stored at the at least one source location before the re-programming procedure is performed; and programming the at least one set of re-programming data into at least one destination location within the at least one NV memory element to be replacement of the at least one set of stored data, wherein the at least one set of re-programming data is programmed into the at least one destination location with a different programming time from a programing time of the at least one set of stored data at the at least one source location; and in response to the re-programming procedure being completed, the memory controller sends completion information of the predetermined host command to the host device, to allow the host device to trigger the shutdown of the memory device.

11. An electronic device comprising the memory device of claim 10, and further comprising:

the host device, coupled to the memory device, wherein the host device comprises:
 at least one processor, arranged for controlling operations of the host device; and
 a power supply circuit, coupled to the at least one processor, arranged for providing power to the at least one processor and the memory device;
wherein the memory device provides the host device with storage space.

12. A memory controller of a memory device, the memory device comprising the memory controller and a non-volatile (NV) memory, the NV memory comprising at least one NV memory element, the memory controller comprising:

a processing circuit, arranged to control the memory controller according to a plurality of host commands from a host device, to allow the host device to access the NV memory through the memory controller;

wherein:

the memory controller receives a predetermined host command from the host device, wherein the predetermined host command indicates that shutdown of the memory device is requested;

in response to the predetermined host command, the memory controller performs a re-programming procedure on the NV memory, for enhancing data storage reliability of the memory device, wherein the re-programming procedure comprises:

performing at least one health checking operation on at least one set of stored data from at least one source location within the at least one NV memory element to generate at least one health checking result, wherein the at least one health checking result indicates whether a health-related score of the at least one set of stored data falls within a predetermined health-related score range;

in response to the at least one health checking result indicating that the health-related score of the at least one set of stored data falls within the predetermined health-related score range, determining to process the at least one set of stored data in the re-programming procedure by reading the at least one set of stored data from at least one source location within the at least one NV memory element and preparing at least one set of re-programming data according to the at least one set of stored data, wherein the at least one set of stored data is stored at the at least one source location before the re-programming procedure is performed; and programming the at least one set of re-programming data into at least one destination location within the at least one NV memory element to be replacement of the at least one set of stored data, wherein the at least one set of re-programming data is programmed into the at least one destination location with a different programming time from a programing time of the at least one set of stored data at the at least one source location; and in response to the re-programming procedure being completed, the memory controller sends completion information of the predetermined host command to the host device, to allow the host device to trigger the shutdown of the memory device.

* * * * *